US006601032B1

(12) United States Patent
Surucu

(10) Patent No.: US 6,601,032 B1
(45) Date of Patent: Jul. 29, 2003

(54) FAST CODE LENGTH SEARCH METHOD FOR MPEG AUDIO ENCODING

(75) Inventor: Fahri Surucu, Fremont, CA (US)

(73) Assignee: Intervideo, Inc., Fremont, CA (US)

( * ) Notice: Subject to any disclaimer, the term of this patent is extended or adjusted under 35 U.S.C. 154(b) by 285 days.

(21) Appl. No.: 09/595,387

(22) Filed: Jun. 14, 2000

(51) Int. Cl.[7] .......................... G10L 19/00

(52) U.S. Cl. .................. 704/500; 704/501; 704/502; 704/503; 704/504

(58) Field of Search .................. 704/500, 501, 704/502, 503, 504; 341/50, 67; 708/203; 375/240.25

(56) References Cited

U.S. PATENT DOCUMENTS

| | | | | |
|---|---|---|---|---|
| 5,227,788 A | * | 7/1993 | Johnston et al. | 341/63 |
| 5,341,457 A | | 8/1994 | Hall, II et al. | |
| 5,535,300 A | | 7/1996 | Hall, II et al. | |
| 5,559,722 A | * | 9/1996 | Nickerson | 364/514 R |
| 5,663,725 A | * | 9/1997 | Jang | 341/67 |
| 5,748,121 A | * | 5/1998 | Romriell | 341/65 |
| 5,848,195 A | * | 12/1998 | Romriell | 382/246 |
| 5,923,376 A | | 7/1999 | Pullen et al. | |
| 5,956,674 A | * | 9/1999 | Smyth et al. | 704/229 |
| 5,974,380 A | * | 10/1999 | Smyth et al. | 704/229 |
| 5,978,762 A | * | 11/1999 | Smyth et al. | 704/229 |
| 6,223,192 B1 | | 4/2001 | Oberman et al. | |
| 6,256,653 B1 | | 7/2001 | Juffa et al. | |
| 6,300,888 B1 | * | 10/2001 | Chen et al. | 341/63 |

OTHER PUBLICATIONS

Moving Pictures Expert Group, "Coding of Moving Pictures and Associated Audio or Digital Storage Media at up to About 1.5 MBIT/s, Part 3 Audio" 3–11171 rev 1.

Moving Pictures Expert Group, "Coding of Moving Pictures and Associated Audio or Digital Storage Media at up to About 1.5 MBIT/s, Part 3 Audio" ISO/IEC 11172–3:1993(E).

* cited by examiner

*Primary Examiner*—Susan McFadden
(74) *Attorney, Agent, or Firm*—Reed Smith; Crosby Heafey LLP

(57) ABSTRACT

A fast code length search method for determining the length of a code in a codebook, wherein the method is especially suited for MPEG-compliant audio encoding. A code length table is created which stores pre-calculated code lengths, including any sign bits and linear extension bits necessary, for data value pairs or quadruples. In one embodiment, two code length tables are created, one for determining the code lengths of the codes used for the ones region, and a second code length table for the big values region. When a code length determination is made, the value is simply read from the table, instead of being calculated each time.

3 Claims, 10 Drawing Sheets

Code length table

FAST CODE LENGTH SEARCH METHOD FOR MPEG AUDIO ENCODING

BACKGROUND OF THE INVENTION

This patent application is related to U.S. Patent Application Ser. No. 09/595,389, entitled "A FAST CODEBOOK SEARCH METHOD FOR OPTIMAL MPEG AUDIO ENCODING" filed Jun. 14, 2000; and is related to U.S. Patent Application Ser. No. 09/595,391, entitled "A FAST LOOP ITERATION AND BITSTREAM FORMATTING METHOD FOR MPEG AUDIO ENCODING" filed Jun. 14, 2000; the disclosures of which are herein incorporated by reference.

1. Field of the Invention

The present invention relates generally to the field of audio encoding, and more particularly to a fast code length search method for determining the length of a code in a codebook, wherein the method is especially suited for MPEG-compliant audio encoding.

2. Description of the Related Art

In general, an audio encoder processes a digital audio signal and produces a compressed bit stream suitable for storage. A standard method for audio encoding and decoding is specified by "CODING OF MOVING PICTURES AND ASSOCIATED AUDIO OR DIGITAL STORAGE MEDIA AT UP TO ABOUT 1.5 MBIT/s, Part 3 Audio" (3-11171 rev 1), submitted for approval to ISO-IEC/JTC1 SC29, and prepared by SC29/WG11, also known as MPEG (Moving Pictures Expert Group). This draft version was adopted with some modifications as ISO/IEC 11172-3:1993(E) (hereinafter "MPEG-1 Audio Encoding"). The disclosure of these MPEG-1 Audio Encoding standard specifications are herein incorporated by reference. This standard is also often referred to as "MP3" or "MP3 audio encoding." The exact encoder algorithm is not standardized, and a compliant system may use various means for encoding such as estimation of the auditory masking threshold, quantization, and scaling. However, the encoder output must be such that a decoder conforming to the MPEG-1 standard will produce audio suitable for an intended application.

As shown in FIG. 1, input audio samples are fed into the encoder 2. The mapping stage 4 creates a filtered and sub-sampled representation of the input audio stream. The mapped samples may be called either sub-band samples (as in Layer I, see below) or transformed sub-band samples (as in Layer III). A psychoacoustic model 10 creates a set of data to control the quantizer and coding block 6. The data supplied by the psychoacoustic model 10 may vary depending on the actual coder implementation 6. One possibility is to use an estimation of a masking threshold to do this quantizer control. The quantizer and coding block 6 creates a set of coding symbols from the mapped input samples. Again, the actual implementation of the quantizer and coder block 6 can depend on the encoding system. The frame packing block 8 assembles the actual bit stream from the output data of the other blocks, and adds other information (e.g. error correction) if necessary.

In general, as shown in FIG. 3, each quantized data frame 30 contains 576 data samples. Each frame 30 is divided into three sub-regions 32, 34, 36, with each region containing an even number of data samples, and with at least one region further divided in sub-regions. Adjacent data samples 38, or "data pairs" are used as X, Y coordinates into a Huffman codebook, which provides a single code value for each data pair, as illustrated in FIG. 4. A codebook is a table containing bit codes for encoding the data pairs and a code length value. For certain regions, the data may be encoded in groups of four (quadruples) instead of pairs. The MPEG-1 standard uses 32 different codebooks, of which two or three are candidates for each sub-region, depending on the maximum data value in each sub-region. The "optimal" codebook for each sub-region is the single codebook from among the candidate codebooks that uses the fewest number of total bits to code the entire sub-region.

Depending on the application, different layers of the coding system having increasing encoder complexity and performance can be used. An ISO MPEG Audio Layer N decoder is able to decode bit stream data which has been encoded in Layer N and all layers below N, as described below:

Layer I:

This layer contains the basic mapping of the digital audio input into 32 sub-bands, fixed segmentation to format the data into blocks, a psychoacoustic model to determine the adaptive bit allocation, and quantization using block companding and formatting.

Layer II:

This layer provides additional coding of bit allocation, scale factors and samples, and a different framing is used.

Layer III:

This layer introduces increased frequency resolution based on a hybrid filter bank. It adds a different (non-uniform) quantizer, adaptive segmentation and entropy coding of the quantized values.

Joint stereo coding can be added as an additional feature to any of the layers.

A decoder 12 accepts the compressed audio bit stream, decodes the data elements, and uses the information to produce digital audio output, as shown in FIG. 2. The bit stream data is fed into the decoder 12. Then, the bit stream unpacking and decoding block 14 performs error detection, if error-checking has been applied by the encoder 2. The bit stream data is unpacked to recover the various pieces of information. The reconstruction block 16 reconstructs the quantized version of the set of mapped samples. The inverse mapping block 18 transforms these mapped samples back into uniform PCM (pulse code modulation).

As originally envisioned by the drafters of the MPEG audio encoder specification, the encoder would be implemented in hardware. Hardware implementations provide dedicated processing, but generally have limited available memory. For software MPEG encoding and decoding implementations, such as software programs running on Intel Pentium™ class microprocessors, the need for greater processing efficiency has arisen, while the memory restrictions are less critical. Specifically, in prior art solutions, the processing time associated with determining a code length of a code in a codebook takes too long.

SUMMARY OF THE INVENTION

The present invention is a fast code length search method for determining the length of a code in a codebook, wherein the method is especially suited for MPEG-compliant audio encoding. A code length table is created which stores pre-calculated code lengths, including any sign bits and linear extension bits necessary, for data value pairs or quadruples. In one embodiment, two code length tables are created, one for determining the code lengths of the codes used for the ones region, and a second code length table for the big values region. When a code length determination is made, the value is simply read from the table, instead of being calculated each and every time.

Thus, the present invention greatly improves the performance of an MPEG encoder. The present method does require additional memory to store the code length tables. The amount of additional memory required, however, is very minimal relative to the total memory requirement of the MPEG-1 Layer III audio encoding. The method of the present invention may be incorporated into a standard MPEG audio encoder in order to improve the processing efficiency of the encoder.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a fast code length search method for determining the length of a code in a codebook, which is especially suited for MPEG-compliant audio encoding. Any and all such modifications, equivalents and alternatives are intended to fall within the spirit and scope of the present invention.

In standard MPEG-1 Layer III audio encoding, optimal choices of quantization step size and scale factors are obtained by using an iterative technique. In general, a Layer III encoder uses noise allocation. The encoder iteratively varies the quantizers in an orderly way, and quantizes the spectral values. The number of Huffman code bits required to code the audio data are counted, and the resulting noise is determined. If, after quantization, there are still scalefactor bands with more than the allowed distortion (as calculated from the psycho-acoustic model), the encoder amplifies the values in those scalefactor bands and effectively decreases the quantizer step for those bands. The process repeats until either:

1. None of the scalefactor bands have more than the allowed distortion;
2. The next iteration would cause the amplification for any of the bands to exceed the maximum allowed value; or
3. The next iteration would require all the scalefactor bands to be amplified.

Figure 5:
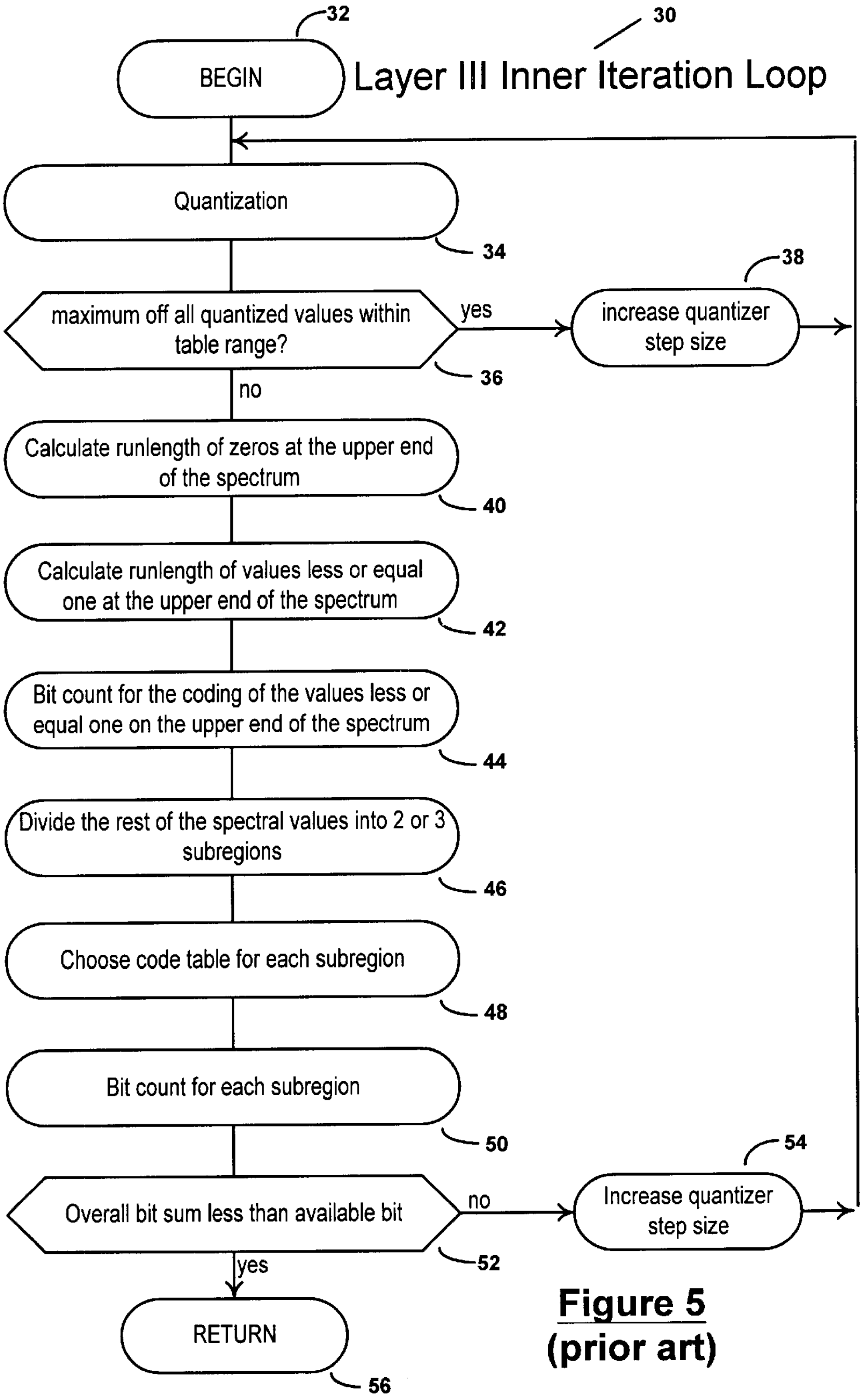
FIG. 5 is a flowchart of the inner iteration loop for ISO MPEG-1 Layer III audio encoding.
Figure 7:
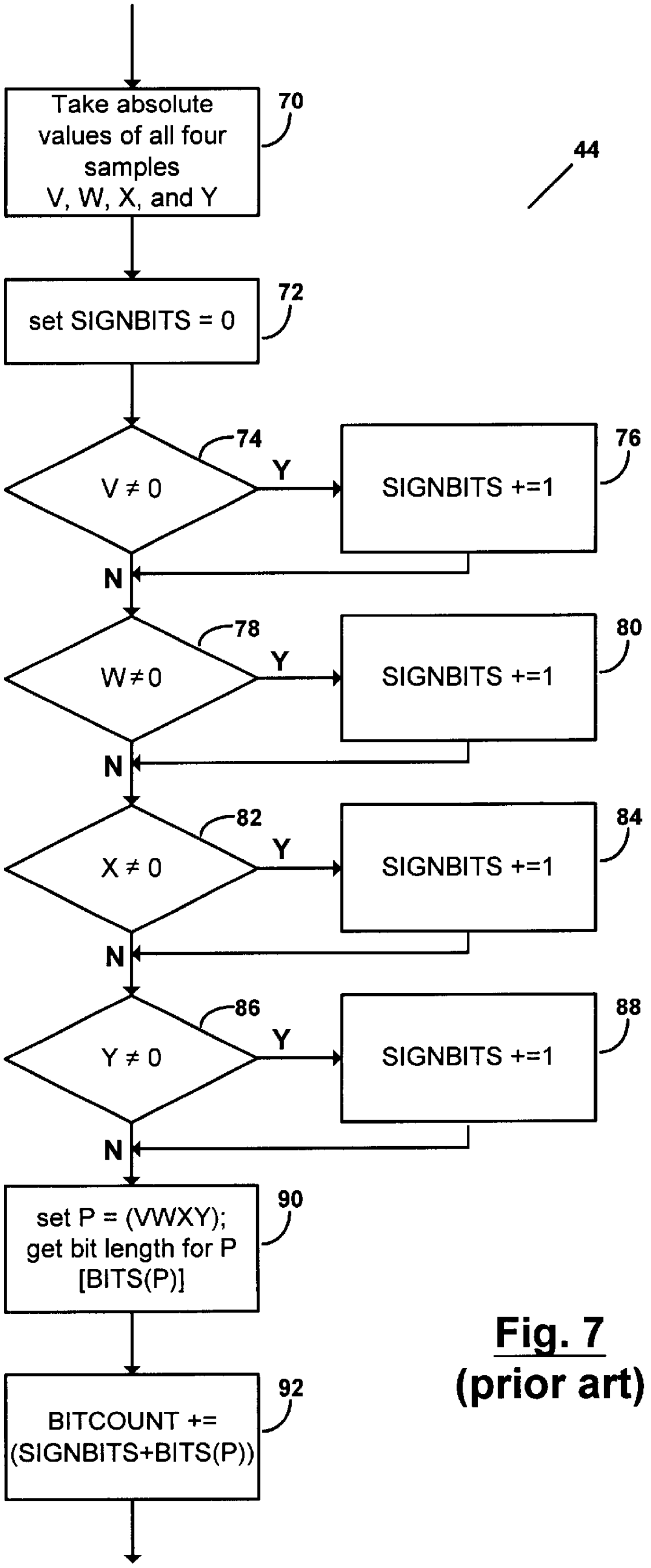
FIG. 7 is a flowchart of the prior art approach to determining the bit count of a code in a codebook for quadruples of spectral values in the ones region.

The above described procedure is known as the "inner iteration loop" for Layer III encoding. FIG. 5 illustrates a flowchart 30 of the "inner iteration loop" for ISO MPEG-1 Layer III audio encoding, as disclosed in the specification document. In order to appreciate the context of the present invention, the flowchart 30 of FIG. 5 will now be described. The flow begins at step 32 and the data is quantized at step 34. If the maximum of all quantized values is within range, then the quantizer step size is increased at step 38, and then the data is re-quantized at step 34. Otherwise, a runlength of zeros at the upper end of the spectrum is counted at step 40. Ordinarily, the upper end of the spectrum contains a string of zeros, and instead of actually using a codebook, it is more efficient to just count the number of zeros. The zeros are then coded as a "runlength" value (i.e. 20 zeros). Similarly, at the upper end of the spectrum there is usually a string of data samples whose values are less than or equal to one (i.e. −1, 0, or +1). At step 42, the runlength for the number of values less than or equal to one is calculated. The actual coded data includes a sign bit, however, and so at step 44 the number of sign bits needed are calculated and added to the code length, in order to produce a total bit count value. The prior art procedure for this process is illustrated in FIG. 7.

The remaining spectral values are then divided into two or three sub-regions at step 46. For each sub-region there are either two or three candidate codebooks that may be used. The optimal codebook from among the candidate codebooks is selected for each sub-region at step 48. The codelengths for the three sub-regions are summed at step 50. Then the total codelength for the entire frame is calculated at step 52 and the size is compared to a limit. If the codelength is too long, the quantizer step size is increased and the procedure repeats back to the quantization step 34, otherwise the loop returns (step 56).

For each granule and channel (left, right) there are 576 spectral values to be coded using Huffman codebooks. These spectral regions are initially divided into three regions:

Zeros Region: The spectral values at the high frequencies tend to have very small values and usually many of them are zero. The "zeros region" (starting from the highest frequency), in which all the spectral values are identical to zero, is not coded at all, but is compressed using runlength compression.

Ones Region: After the "zeros region" toward the low frequencies the spectral values become non-zero and can be at most +/−8191. Before the spectral values get very large, however, there is usually a region of spectral values which are only −1, 0, or 1. This region is called the "ones region" and the values are encoded by either Huffman codebook A or Huffman codebook B. The values are coded as groups of four samples (quadruples), as defined by the MPEG Audio Encoding specification.

Big Values Region: Finally, the rest of the spectral range is called the big values region, which contains at least one spectral value with magnitude larger than one. These values are coded as groups of two (pairs). There are only 29 Huffman codebooks used to encode this region. The Big Values region, depending on the actual audio signal, is divided into either 2 or 3 sub regions and each sub region is encoded with different Huffman codebooks. There are three possible sub region settings (which identify the sub region boundaries in terms of spectral frequency).

FIG. 7 is a flowchart of the prior art approach to determining the bit count of a code in a codebook for quadruples of spectral values in the ones region (i.e. step 44 of FIG. 5). In general, the data values in the ones region are either −1, 0, or 1. The total length of the code for a quadruple is the length of the actual code itself, plus any sign bits that are needed. Thus, the number of sign bits needs to be calculated in order to determine the total number of bits used by a codebook to code the data. According to the prior art approach, the absolute values are taken of the four data samples (step 70). A SIGNBITS counter is set to zero at step 72. Then, for each of the four values V, W, X, and Y, if the value is not zero (i.e. has either a positive or negative sign) (steps 74, 78, 82, 86), the SIGNBITS counter is incremented (steps 76, 80, 84, 88). Then at step 90, the code length BITS (P) for the code corresponding to the quadruple P=(VWXY is determined. The actual total bit count is therefore the value of the SIGNBITS counter plus the code length BITS (P). Since this procedure is performed inside the inner iteration loop, it takes significant processing time just to determine the bit count for the data values using a particular codebook.

Figure 6:
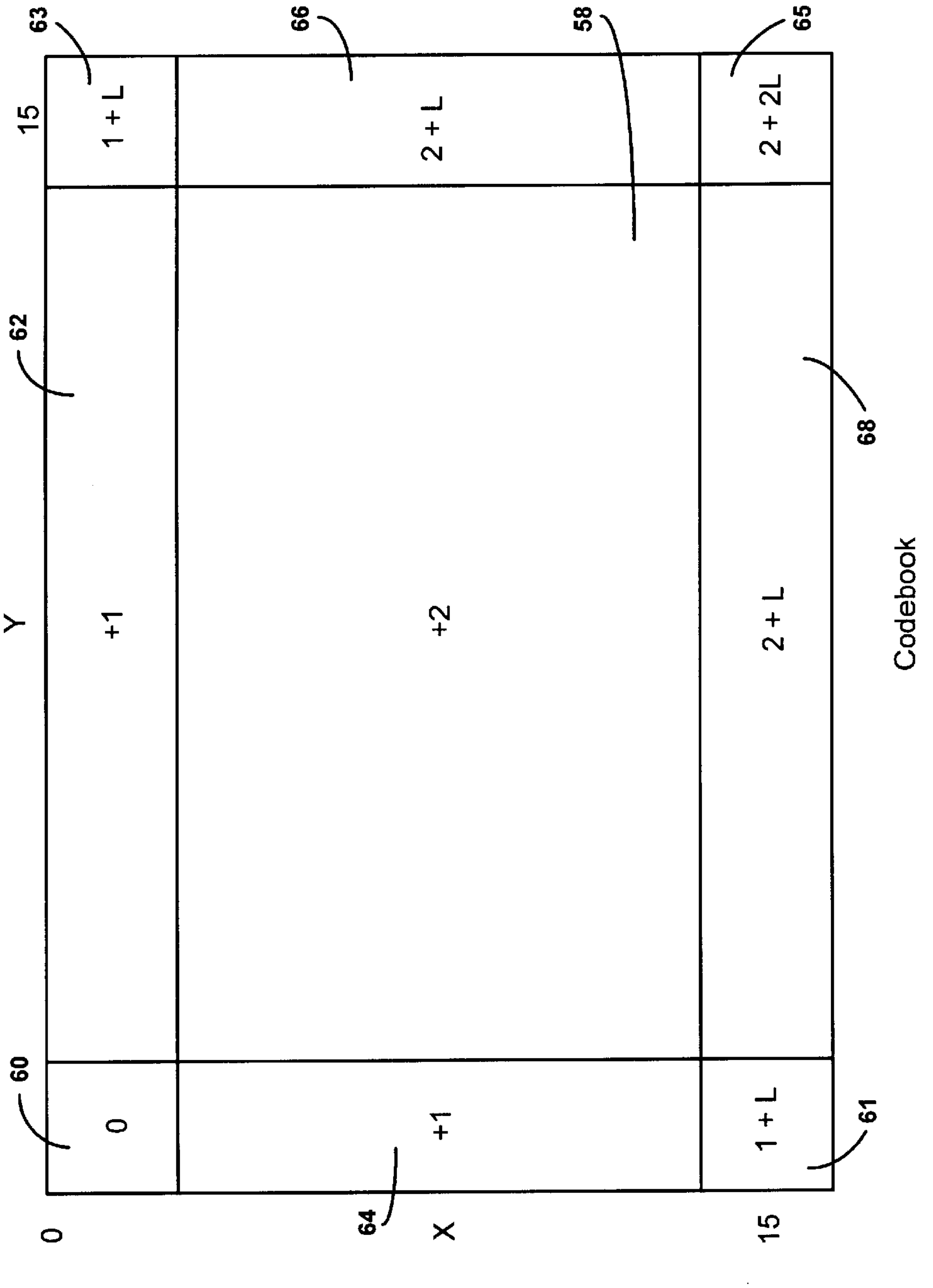
FIG. 6 is a diagram of a codebook for coding data values greater than 15 and showing the regions for sign bit extension.

FIG. 6 is a diagram of a codebook for coding data values greater than 15, and showing the region for sign bit extension. If the X, Y pair are both zero 60, then no sign extension is needed. However, if either X or Y is zero 64, 62, then one sign extension bit is necessary. For X and Y values from one to fourteen 58, two sign extension bits are needed. If either X or Y are greater than or equal to the value "15," then linear extension bits are used, in addition to the sign extension bits, to represent the code 66, 68. If both X and Y are greater than or equal to the value "15" [block 65] then two sign extension bits are needed, as well as twice the standard linear bit extension length L. If X is "15" and Y is "0" then one sign extension bit and a standard linear bit extension length L [block 61] are used. Similarly, if X is "0" and Y is "15" then one sign extension bit and a standard linear bit extension length L [block 63] are used. The value of length L depends on the codebook being used.

As illustrated by FIG. 6, the codebook indices only go up to the value "15." For data values greater than or equal to 15 in the big values region, the actual code is determined by using linear extension bits. In order to code "40" for example, a difference between the values "40" and "15" is calculated, which is the value "25." The code for "15" is read from the codebook, and then the binary value "25" (using a certain number of bits that is specific to the codebook) is appended to the code for "15." Thus, the actual code length for the data pair (1,40) is the length for (1,15), plus the number of linear bits used to represent the value "25." As with the ones region, two signs bits are used, since both numbers are non-zero.

Figure 8:
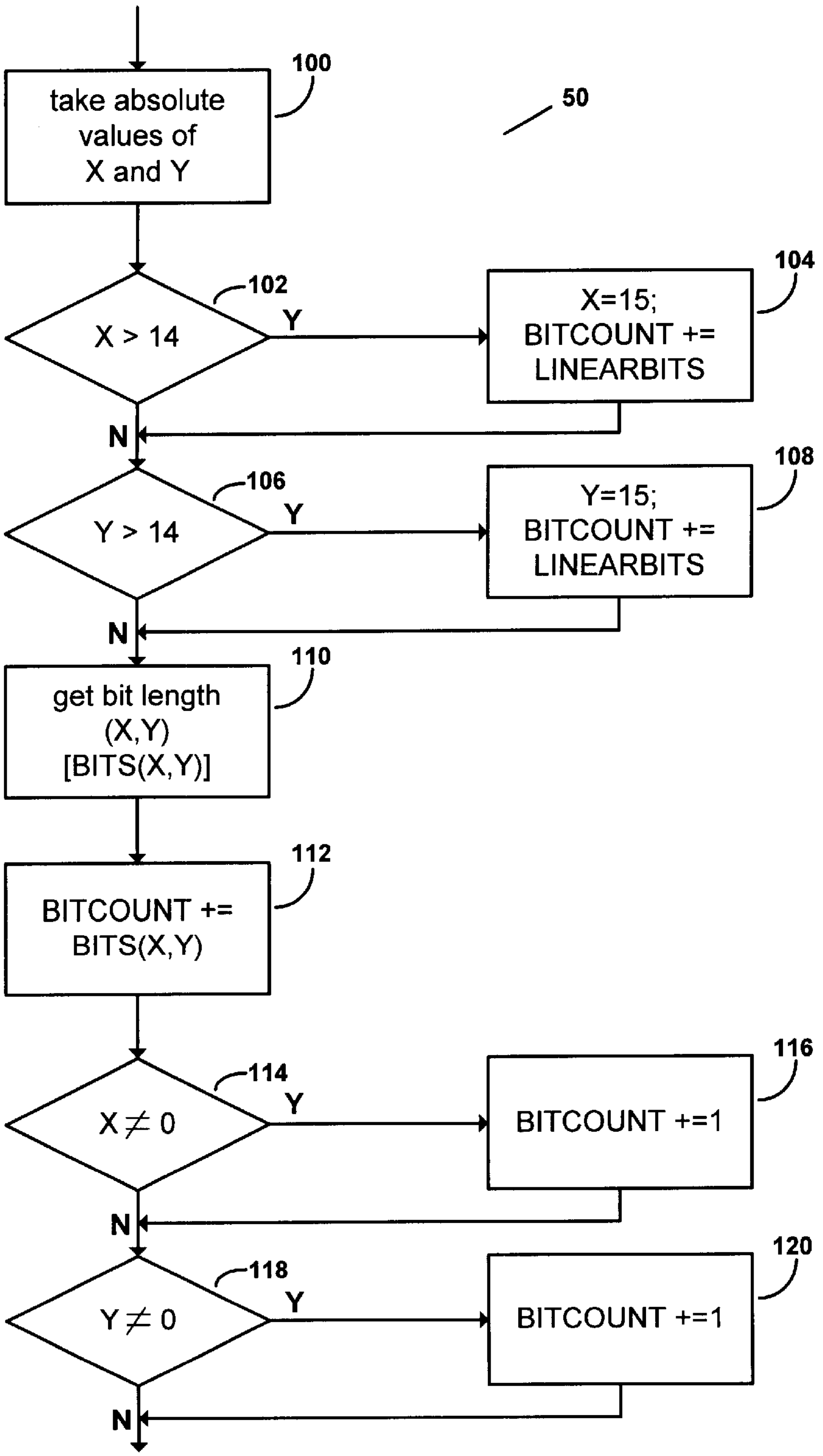
FIG. 8 is a flowchart of the prior art approach to determining the bit count of a code in a codebook for data pairs in the big values region.

FIG. 8 is a flowchart of the prior art approach to determining the bit count of a code in a codebook for data pairs in the big values region. First, the absolute values of the data values X, and Y are taken at step 100. If X is greater than 14 at step 102, then X is set equal to 15 (i.e. the code corresponding to an index value of 15), and a counter BITCOUNT is set equal to the number of linear bits associated with the codebook at step 104. Similarly, if Y is greater than 14 at step 106, then Y is set equal to 15 (i.e. the code corresponding to an index value of 15), and the counter BITCOUNT is incremented by the number of linear bits of the codebook at step 108. The actual bit length for the code corresponding to the X, Y data pair is then determined at step 110, and the BITCOUNT counter is incremented with the code length value at step 112. If X is not equal to zero at step 114, then the BITCOUNT counter is incremented by one at step 116 (i.e. a sign bit will be needed). If Y is not equal to zero at step 118, then the BITCOUNT counter is incremented by one to account for the additional sign bit.

As can be appreciated from the flowcharts of FIGS. 7 and 8, the code length determination blocks are computationally intensive. This fact is compounded by the fact that the calculations are performed within the inner iteration loop. Thus, according to the present invention, separate code length tables are created that contain the actual pre-calculated code lengths, including linear bit extensions and sign bits, for all possible input data values. The tables are stored in memory and when the encoder encodes data, the bit length calculations do not need to be repeated for each iteration. While the present invention increases the memory requirements necessary to implement an encoder, the execution performance is greatly enhanced. For software implementations, the extra memory required is generally insignificant, compared to the total memory required to implement the entire encoder.

Figure 9A:
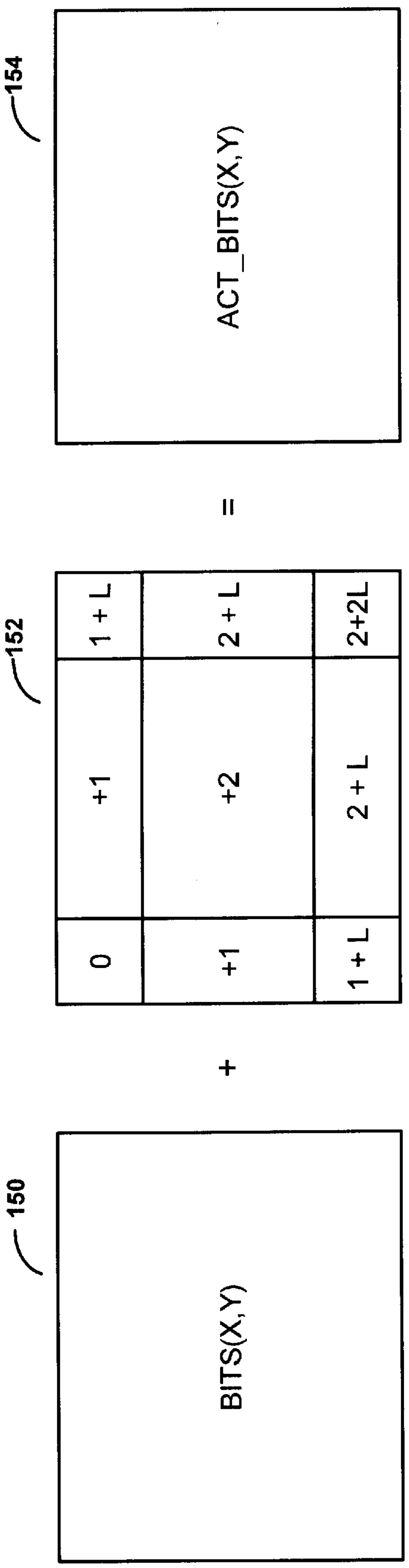
FIG. 9(A) illustrates the calculation of the actual bit length.
Figure 9B:
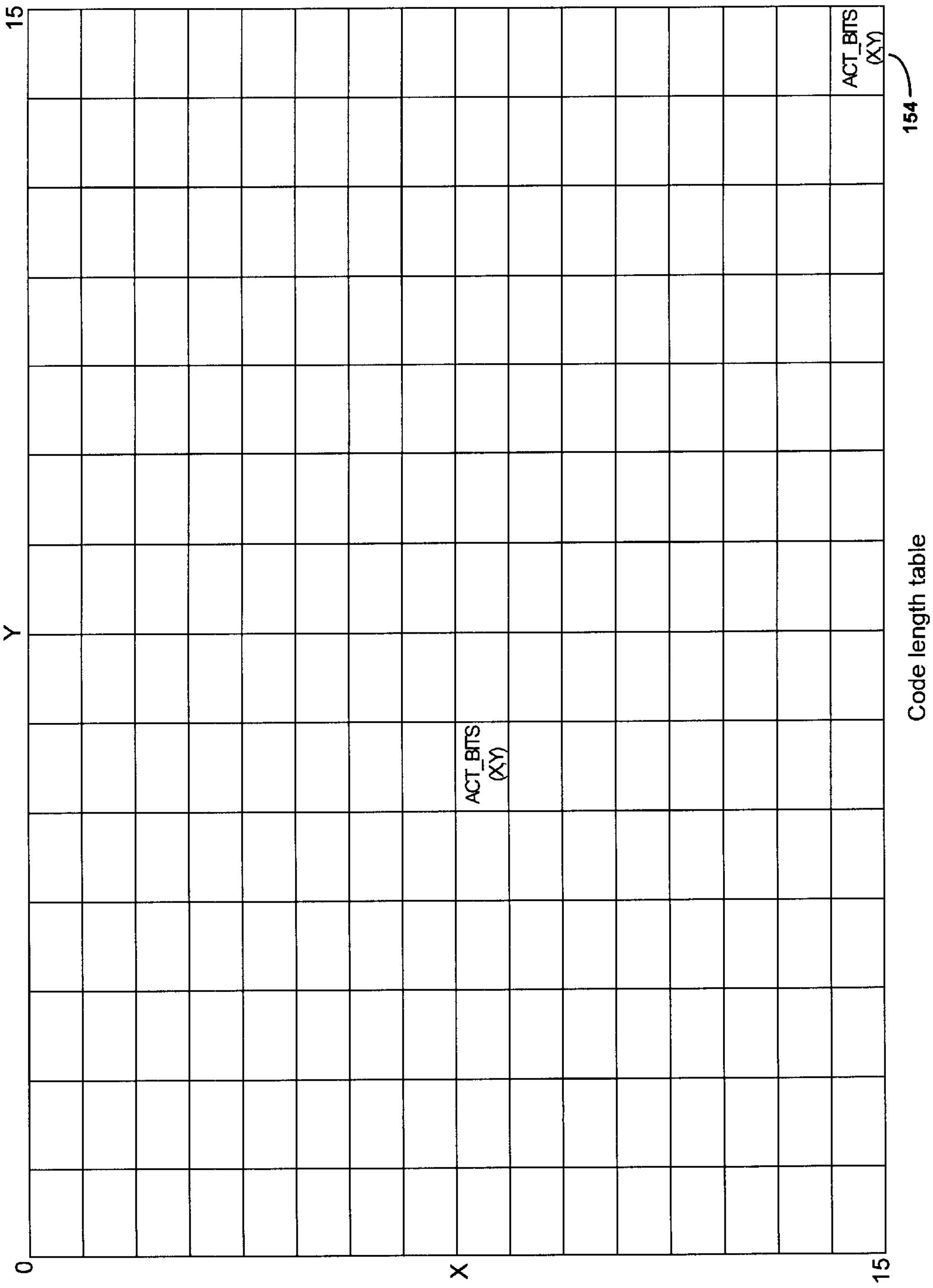
FIG. 9(B) is a diagram of a bit length table constructed according to the present invention.

The present invention is illustrated by FIGS. 9(A) and 9(B). In FIG. 9(A), the code length corresponding to an entry in a codebook is illustrated by BITS(X,Y) 150. To this value, the number of sign extension and linear bits 152 (as described in FIG. 6) is added to the BITS(X,Y) value. The result is the actual total number of bits ACT_BITS(X,Y) 154. As shown in FIG. 9(B), the ACT_BITS(X,Y) values are placed in a separate code length table.

According to the present invention, the code length tables have the same number of rows and columns as the original tables. The number of linear extension bits is only dependent on the code table used, and not the index value. For example, a particular codebook may use six bits for linear extension. In this case, the extension bits used to represent "40" would be "011001" (not 11001), which is equivalent to "25" (40−15) in binary representation.

Figure 10:
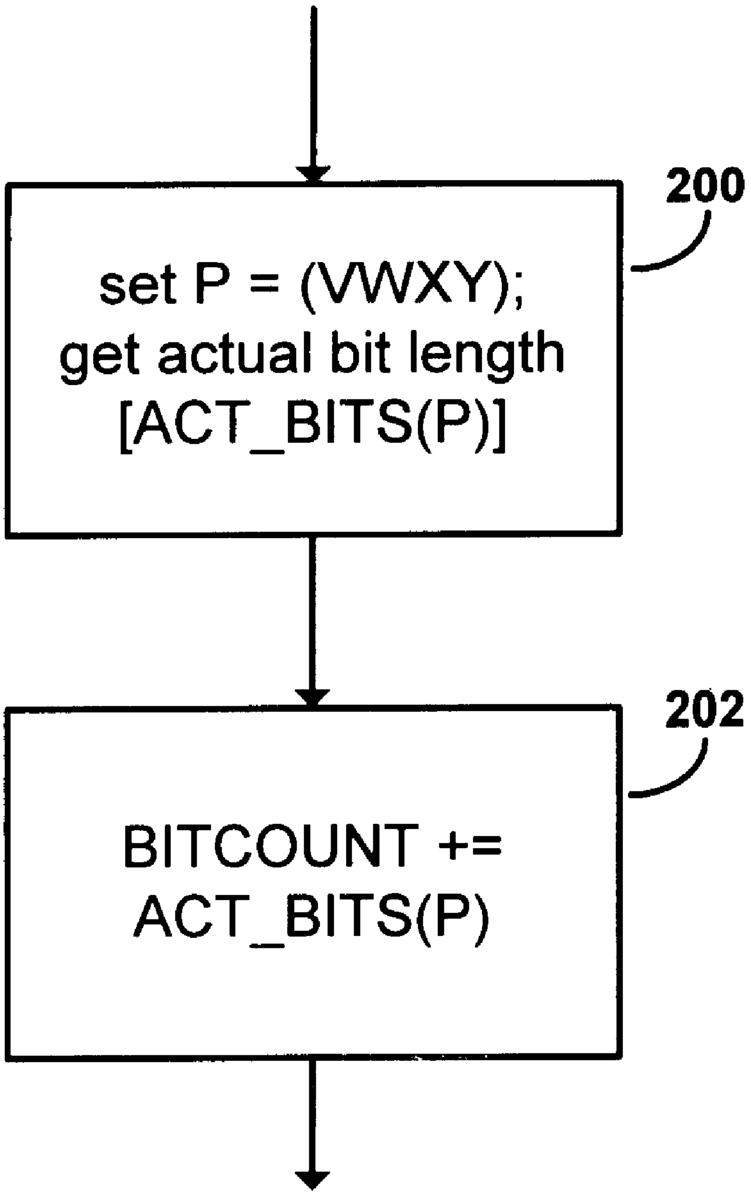
FIG. 10 is a flowchart of the method of the present invention for determining the actual bit length of a code in a codebook for quadruples of spectral values in the ones region.
Figure 11:
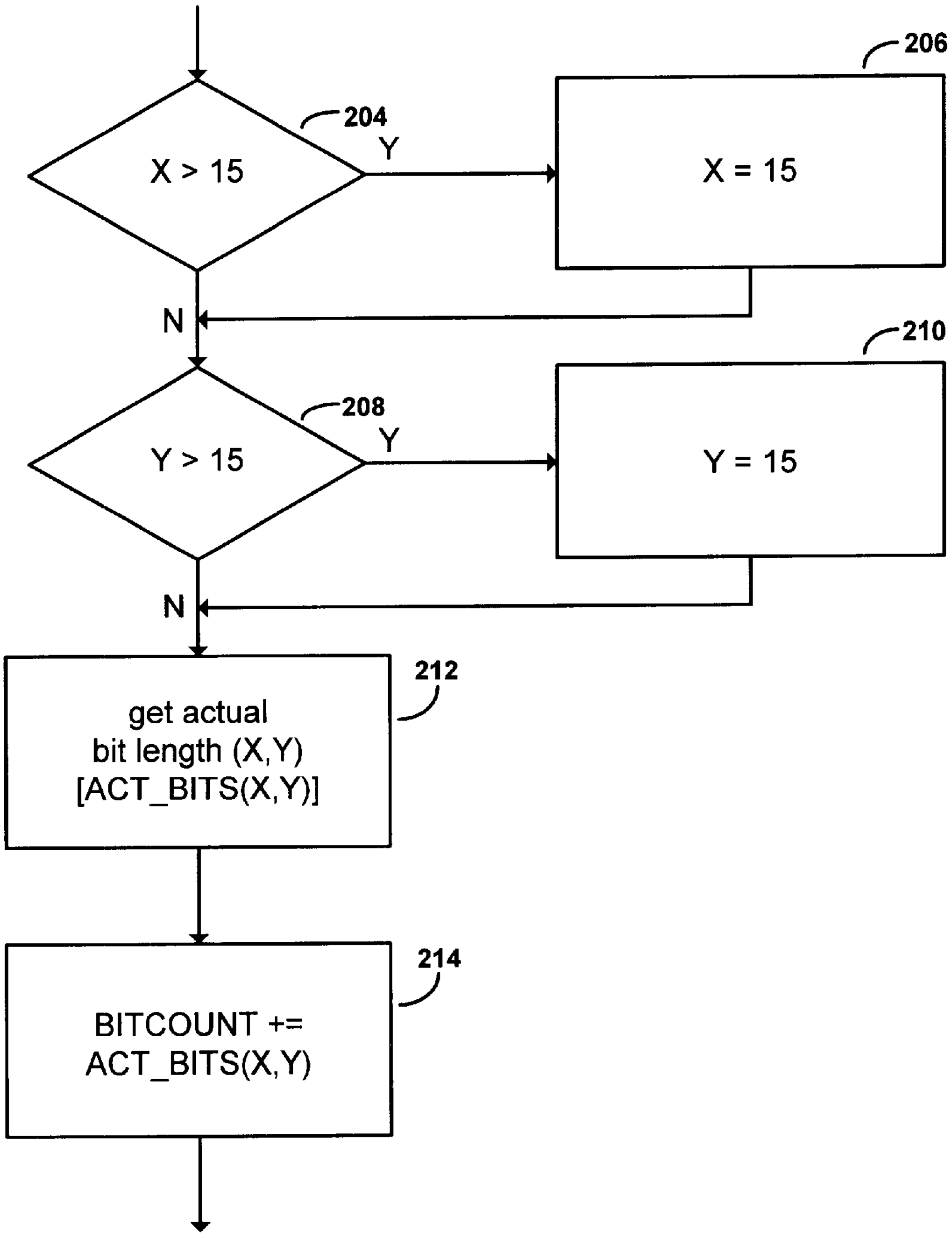
FIG. 11 is a flowchart of the method of the present invention for determining the actual bit length of a code in a codebook for data pairs in the big values region.

With code length tables incorporated within an encoder, the procedure for determining the code length for a data input values is greatly simplified. As shown in FIG. 10, the table entry in the code length table corresponding to the quadruple for the ones region is read at step 200, and the BITCOUNT counter is simply incremented with the table entry value. FIG. 11 illustrates the procedure for the big values region. If X is greater than 15 (step 204), then X is first set equal to "15" (step 206). Similarly, if Y is greater than 15 (step 208), then Y is set equal to "15" (step 210). The actual code length is determined by using the X, Y data pair to read an entry from the code length table (ACT_BITS(X, Y) )at step 212. The BITCOUNT counter is incremented with this value at step 214.

Figure 1:
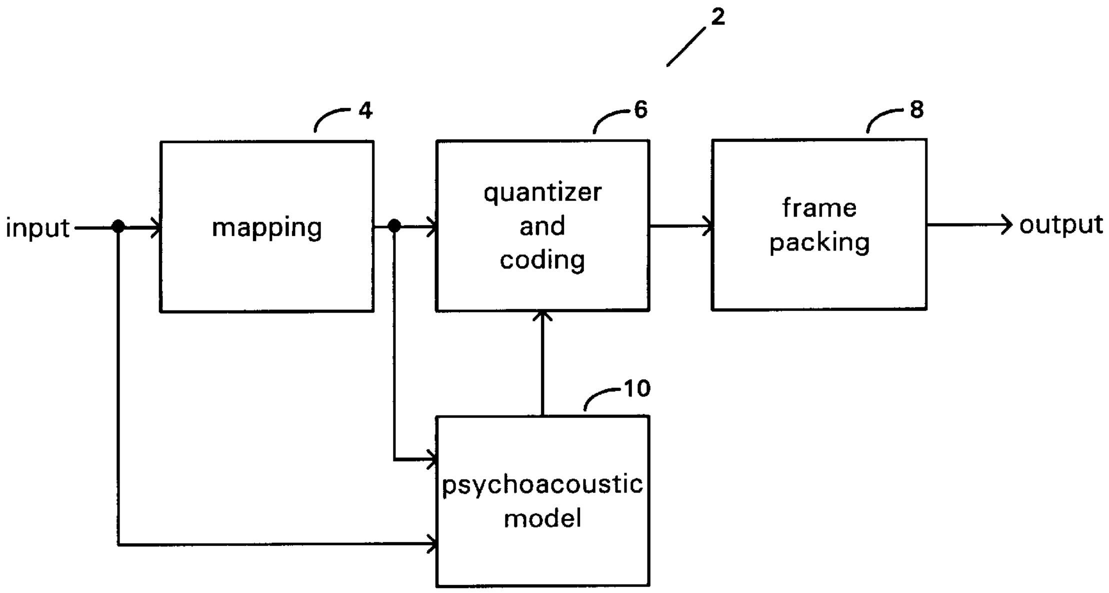
FIG. 1 is a block diagram of an audio encoder.
Figure 2:
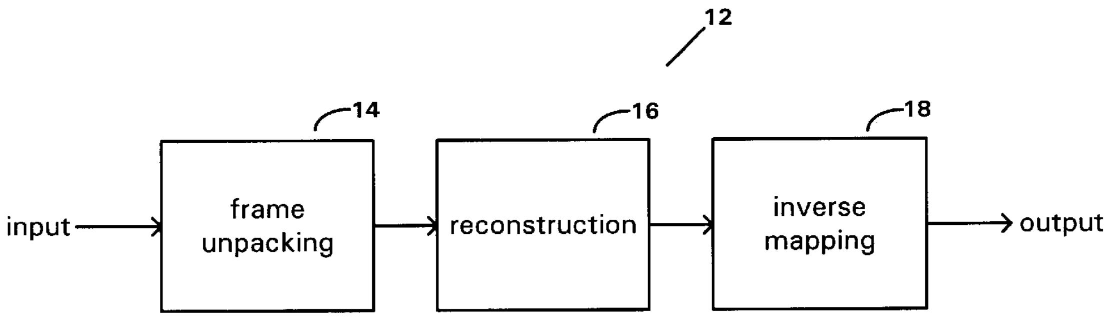
FIG. 2 is a block diagram of an audio decoder.
Figure 3:
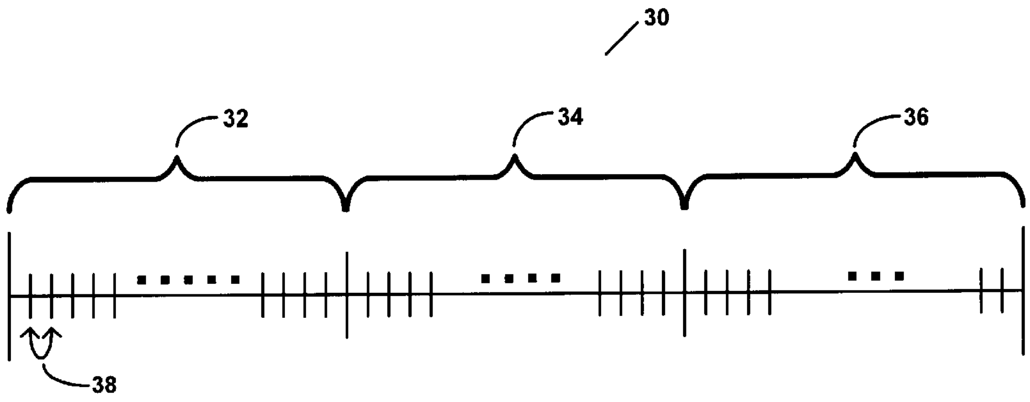
FIG. 3 is a diagram illustrating three sub-regions within a frame.
Figure 4:
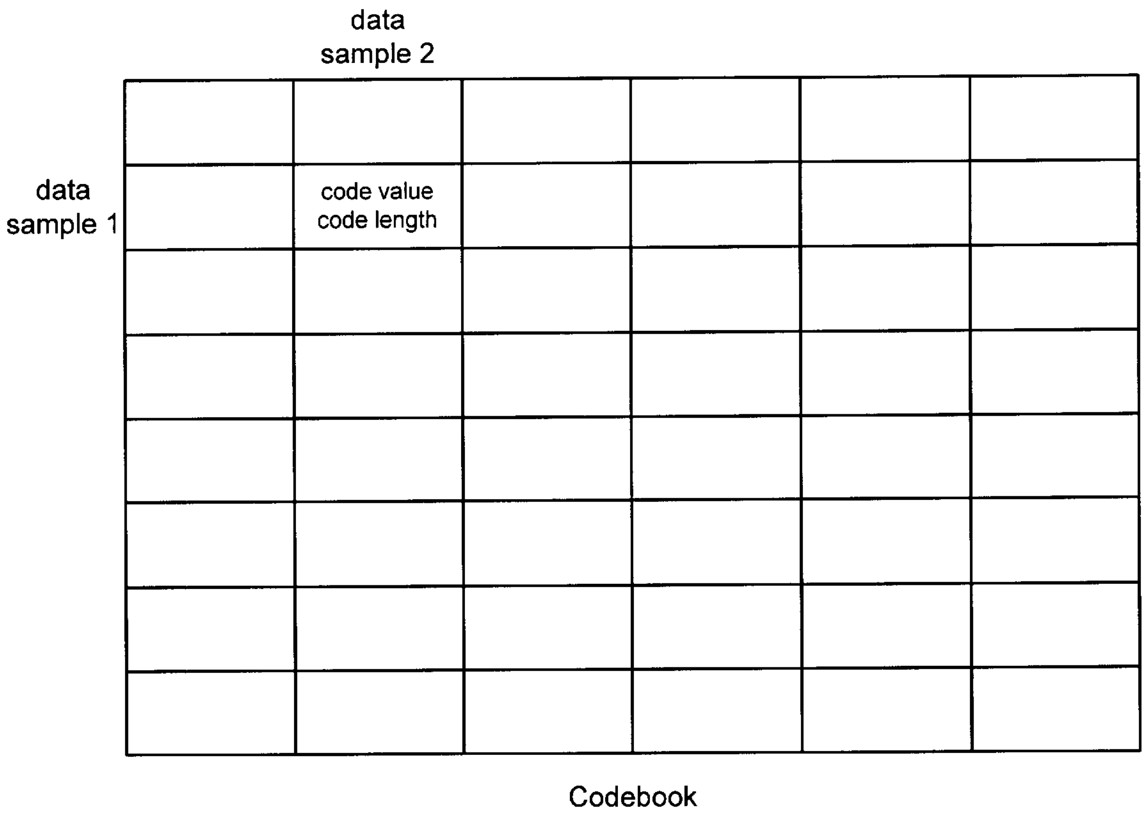
FIG. 4 is an example of a codebook.

Thus, the present invention greatly improves the performance of an MPEG encoder. The only disadvantage of the present method is that additional memory is needed to store the code length table(s). The amount of additional memory required, however, is very minimal relative to the total memory requirement of the MPEG-1 Layer III audio encoding. The method of the present invention may be incorporated into the encoder 2 of FIG. 1, specifically the coding block 6, in order to provide a more efficient encoder. Note that the present invention may advantageously be applied to both steps 44 and 50 of FIG. 5

Those skilled in the art will appreciate that various adaptations and modifications of the just-described embodiments can be configured without departing from the scope and spirit of the invention. Therefore, it is to be understood that, within the scope of the appended claims, the invention may be practiced other than as specifically described herein.

What is claimed is:

1. A method for encoding digital data, the method comprising:

creating a first code length table containing pre-calculated total code length values for a ones region, wherein the total code length values comprise a code length and a sign extension count;

creating a second code length table containing pre-calculated total code length values for a big values region, wherein the total code length values comprise a code length, a sign extension count, and a linear bit extension count;

storing the first and second code length tables in memory prior to encoding a digital data stream;

receiving an input digital data frame and for each data sample in the input digital data frame;

determining a corresponding size entry in one of the code length tables; and adding the size entry to a total length counter;

wherein after processing the data frame, if a value of the total length counter is within a predetermined range, then the data frame is encoded, otherwise a quantization procedure is adjusted, and the steps of determining a corresponding size entry and adding the size entry to a total length counter are repeated for the data frame.

2. An MPEG audio encoder for encoding audio data, the encoder comprising:

a first table containing pre-calculated total code length values for a ones region, wherein the total code length values comprise a code length and a sign extension count;

a second table containing pre-calculated total code length values for a big values region, wherein the total code length values comprise a code length, a sign extension count, and a linear bit extension count;

a total length counter for summing a total bit length count; and a processor for processing an input audio data frame and comparing the total bit length count with a predetermined range, wherein after processing the data frame, if a value of the total length counter is within a predetermined range, then the audio data frame is encoded with a selected codebook, otherwise a quantization procedure is adjusted, and a new total length counter value is determined.

3. A computer readable medium including computer program code for encoding digital data, said computer readable medium comprising:

computer program code for storing a first table containing pre-calculated total code length values for a ones region, wherein the total code length values comprise a code length and a sign extension count;

computer program code for storing a second table containing pre-calculated total code length values for a big values region, wherein the total code length values comprise a code length a sign extension count, and a linear bit extension count;

computer program code for receiving an input digital data frame and for each data sample in the input digital data frame;

computer program code for determining a corresponding size entry in the at least one code length table; and computer program code for adding the size entry to a total length counter;

wherein after processing the data frame, if a value of the total length counter is within a predetermined range, then the data frame is encoded, otherwise a quantization procedure is adjusted, and the code for determining a corresponding size entry and adding the size entry to a total length counter are repeated for the data frame.

* * * * *